(12) United States Patent
Kubo

(10) Patent No.: US 9,204,551 B2
(45) Date of Patent: Dec. 1, 2015

(54) MOUNTING STRUCTURE AND MOUNTING METHOD

(75) Inventor: Masahiro Kubo, Tokyo (JP)

(73) Assignee: Lenovo Innovations Limited (Hong Kong), Quarry Bay (HK)

(*) Notice: Subject to any disclaimer, the term of this patent is extended or adjusted under 35 U.S.C. 154(b) by 336 days.

(21) Appl. No.: 13/883,130

(22) PCT Filed: Nov. 8, 2011

(86) PCT No.: PCT/JP2011/075707
§ 371 (c)(1),
(2), (4) Date: May 2, 2013

(87) PCT Pub. No.: WO2012/070381
PCT Pub. Date: May 31, 2012

(65) Prior Publication Data
US 2013/0220688 A1  Aug. 29, 2013

(30) Foreign Application Priority Data

Nov. 22, 2010 (JP) ................................ 2010-259727

(51) Int. Cl.
*H02B 1/00* (2006.01)
*H05K 1/18* (2006.01)
(Continued)

(52) U.S. Cl.
CPC ............... *H05K 1/18* (2013.01); *G02B 6/4239* (2013.01); *G02B 6/4274* (2013.01); *H01L 23/13* (2013.01); *H01L 24/13* (2013.01); *H01L 24/16* (2013.01); *H01L 24/17* (2013.01); *H01L 24/81* (2013.01); *H05K 3/3421* (2013.01); *H05K 3/3436* (2013.01); *G02B 6/4214* (2013.01); *G02B 6/4232* (2013.01); *H01L 2224/0401* (2013.01);
(Continued)

(58) Field of Classification Search
USPC ................................ 361/770, 76, 7
See application file for complete search history.

(56) References Cited

U.S. PATENT DOCUMENTS 6,365,500 B1 * 4/2002 Chang et al. ................ 438/614
6,392,144 B1 * 5/2002 Filter et al. .................... 174/535
(Continued)

FOREIGN PATENT DOCUMENTS

CN  1475824  2/2004
JP  62-74335  5/1987
(Continued)

OTHER PUBLICATIONS

CN Office Action dated Apr. 29, 2014, with English translation.
(Continued)

*Primary Examiner* — Steven T Sawyer

(57) ABSTRACT

Provided is a mounting structure capable of maintaining highly accurate connection reliability even when the temperature of the environment in which the mounting structure is used is high. Mounting structure (10) includes electronic component (11), metal (12), wiring substrate (13), and a preventing structure. Electronic component (11) includes first electrode (14). The melting point of metal (12) is 130° C. or less. Wiring substrate (13) includes second electrode (15) electrically connected to first electrode (14) via metal (12). The preventing structure prevents flowing-out of metal (12) in a melted state from a region where first electrode (14) and second electrode (15) are formed. Further, preventing structure (14) is formed in at least one member selected from electronic component (11) and wiring substrate (12).

11 Claims, 5 Drawing Sheets

(51) Int. Cl.
*H01L 23/13* (2006.01)
*H05K 3/34* (2006.01)
*H01L 23/00* (2006.01)
*H05K 1/11* (2006.01)
*H05K 1/02* (2006.01)
*G02B 6/42* (2006.01)

(52) U.S. Cl.
CPC .......... *H01L 2224/05568* (2013.01); *H01L 2224/05571* (2013.01); *H01L 2224/05624* (2013.01); *H01L 2224/05644* (2013.01); *H01L 2224/05655* (2013.01); *H01L 2224/10145* (2013.01); *H01L 2224/10175* (2013.01); *H01L 2224/13011* (2013.01); *H01L 2224/13019* (2013.01); *H01L 2224/1319* (2013.01); *H01L 2224/13023* (2013.01); *H01L 2224/13109* (2013.01); *H01L 2224/13111* (2013.01); *H01L 2224/16237* (2013.01); *H01L 2224/17505* (2013.01); *H01L 2224/17517* (2013.01); *H01L 2224/29111* (2013.01); *H01L 2224/814* (2013.01); *H01L 2224/81191* (2013.01); *H01L 2224/81192* (2013.01); *H01L 2224/81193* (2013.01); *H01L 2224/81385* (2013.01); *H01L 2224/81815* (2013.01); *H01L 2224/81902* (2013.01); *H01L 2924/15787* (2013.01); *H05K 1/0274* (2013.01); *H05K 1/111* (2013.01); *H05K 2201/09045* (2013.01); *H05K 2201/09472* (2013.01); *H05K 2203/0307* (2013.01); *H05K 2203/1173* (2013.01); *Y10T 29/49144* (2015.01)

(56) References Cited

U.S. PATENT DOCUMENTS

| | | |
|---|---|---|
| 7,120,325 B1 | 10/2006 | Uchida |
| 7,750,484 B2 | 7/2010 | Mizuno et al. |
| 2009/0001571 A1* | 1/2009 | Mizuno et al. ............ 257/737 |
| 2009/0074353 A1* | 3/2009 | Yanagisawa ................ 385/14 |
| 2009/0183901 A1* | 7/2009 | Kataoka et al. ............ 174/257 |
| 2010/0291723 A1 | 11/2010 | Low et al. |

FOREIGN PATENT DOCUMENTS

| | | |
|---|---|---|
| JP | 04-023388 | 1/1992 |
| JP | 4-240741 | 8/1992 |
| JP | 05-013496 | 1/1993 |
| JP | 05-50777 | 7/1993 |
| JP | 07-221421 | 8/1995 |
| JP | 10-163267 | 6/1998 |
| JP | 11-163049 | 6/1999 |
| JP | 2003-020404 | 1/2003 |
| JP | 2003-188204 | 7/2003 |
| JP | 2007-242900 | 9/2007 |
| JP | 2009-009994 | 1/2009 |
| JP | 2010-103161 | 5/2010 |
| JP | 2010-538419 | 12/2010 |
| TW | 2009-03758 | 1/2009 |
| TW | 2009-18287 | 5/2009 |

OTHER PUBLICATIONS

JP Office Action dated Nov. 14, 2013, with English Translation.
International Search Report, PCT/JP2011/075707, Feb. 14, 2012.

* cited by examiner

MOUNTING STRUCTURE AND MOUNTING METHOD

TECHNICAL FIELD

The present invention relates to a mounting structure and a mounting method for electronic components.

BACKGROUND ART

Recently, there has been rapid progress in weight reduction, thinning and miniaturization of electronic devices, and there is the requirement that electronic components that are to be amounted be reduced in weight, thinned, and miniaturized.

At present, for many electronic devices, solid solder is used as a material for connecting an electronic component and a wiring substrate. To mount the electronic component on the wiring substrate, solder paste is printed on an electrode pad in which a nickel or gold thin film has been formed. The solder is heated to melt at a temperature equal to or higher than the melting temperature of the solder, and the electrode pad and the solder are connected. To mount the electronic component on the wiring substrate, the electrode pad of the electronic component and the electrode pad of the wiring substrate are aligned with each other under a normal temperature. Then, the temperature is increased until spare solder melts on the electronic component and the wiring substrate. After the solder has been wetted to spread on the electronic component and the wiring substrate, the temperature is decreased. Thus, by decreasing the temperature of the electronic component and the wiring substrate to solidify the solder, a solid connection portion is formed between the electronic component and the wiring substrate.

As the package structure of the electronic component, there is a structure referred to as a QFP (Quad Flat Package). The QFP is a structure where an electric signal is transferred between the electronic component and the wiring substrate by locating the connection terminal of the electronic component on the outer periphery of the package and connecting the connection terminal to the wiring substrate.

However, in the QFP, an input-output terminal can be disposed only on the outer periphery of the package. Consequently, a dead space having no connection terminal is generated near the package center. This makes the QFP unsuitable as a structure for accommodating any increase in input-output terminals that occurs when there is an increase in the amount of information, and the QFP is disadvantageous in that it does not have high density capability.

To solve such a problem, a structure referred to as a BGA (Ball Grid Array) having external connection terminals in both the outer periphery and the center of the electronic component is used. The BGA structure is a structure where high density mounting can be achieved by forming an outer connection terminal on the entire surface of a semiconductor element. However, the following problems occur even in such a structure where high density mounting can be achieved.

Generally, the linear expansion coefficient of the electronic component and the linear expansion coefficient of the wiring substrate are different from each other. Due to heating and cooling during operation of the electronic component, a difference is generated in the linear expansion coefficient between the electronic component and the wiring substrate. The difference in linear expansion coefficient generates stress on solid solder that is used to connect the electronic component and the wiring substrate, thus causing a creeping phenomenon which is seen in a solid metal material. Distortion which is generated by the creeping phenomenon accumulates in the connection portion between the wiring substrate and the electronic component to cause cracks in the connection portion between the wiring substrate and the electronic component. The cracks, when they grow, lead to disconnection of the connection portion between the wiring substrate and the electronic component.

The recent computerization of an automobile functions has been accompanied by cases in which electronic devices, such as devices within the engine housing, or the like, operate in a high temperature environment of 130° C. or higher. In such an environment, a creeping phenomenon, in particular, easily occurs. Thus, an electronic device capable of maintaining highly accurate connection reliability even under such a high temperature environment is required.

A technology for the electronic device capable of maintaining highly accurate connection reliability is described in, for example, JP11-163049A (Patent Literature 1), JP2003-020404A (Patent Literature 2), and JP4-240741A (Patent Literature 3).

Patent Literature 1 describes a method for reinforcing a solder connection portion by supplying and curing a liquid resin referred to as underfill resin in the solder connection portion between the electronic component and the wiring substrate. According to this method, stress which is generated between the electronic component and the wiring substrate is dispersed not only to the solder connection portion but also to the entire surface of the underfill resin.

Patent Literature 2 describes a technology for reducing creeping distortion by forming a flexible stress relaxation layer in a connection portion between the electronic component and the wiring substrate.

Patent Literature 3 describes a structure for applying a low melting-point metal in a connection portion. More specifically, a structure is described, where a gold bump is used as the bump of a semiconductor side, the low melting-point metal is applied to its leading end, and the semiconductor element and the wiring substrate are connected. Thus, stress within a temperature condition range where the low melting-point metal melts is relaxed, and reliability improvement can be expected.

CITATION LIST

Patent Literature 1: JP11-163049A
Patent Literature 2: JP2003-020404A
Patent Literature 3: JP4-240741A

SUMMARY OF INVENTION

Problems to be Solved

However, the method described in Patent Literature 1 cannot prevent the occurrence of a creeping phenomenon while the method can prolong the period of time until disconnection. Consequently, the generation or the growth of cracks cannot be completely prevented. Thus, there is a problem of insufficient connection reliability when the electronic device is used in a place such as in the engine room of the car where the temperature easily becomes high.

The method described in Patent Literature 2 cannot completely prevent the generation or the growth of cracks including an insulating layer while the method can prolong the period of time until disconnection.

Further, the connection portion and the entire semiconductor element described in Patent Literature 3 are sealed with resins. When the semiconductor element and the wiring substrate are connected by using the low melting-point metal, resin sealing is necessary from the viewpoint of preventing flowing-out when the low melting-point metal melts and achieving shock resistance and environment resistance. On the other hand, thinning and a higher density have recently been required of a semiconductor package, and the gap between the semiconductor element and the wiring substrate has been narrowed. The sealing resin is densely filled with inorganic fillers to reduce thermal expansion difference between the semiconductor element and the wiring substrate. This creates a difficulty of filling all the narrow gaps with sealing resin due to the lowered fluidity of the sealing resin. As a result, it is difficult to provide a highly reliable connection portion.

The present invention has been developed with such problems in mind, and it is an object of the invention to provide a mounting structure and a mounting method capable of maintaining highly accurate connection reliability even when the temperature of the environment in which the mounting structure is used is high.

Solution to Problem

According to the present invention, there is provided a mounting structure that includes an electronic component, a metal, a wiring substrate, and a preventing structure. The electronic component includes a first electrode. The metal has a melting point of 130° C. or less. The wiring substrate includes a second electrode electrically connected to the first electrode via the metal. The preventing structure prevents metal flow out in a melted state from a region where the first electrode and the second electrode are formed. Further, the preventing structure is formed in at least one member selected from the electronic component and the wiring substrate.

According to the present invention, there is provided a mounting method for mounting an electronic component including a first electrode on a wiring substrate including a second electrode. The method includes supplying a metal having a melting point of 130° C. or less to at least one electrode selected from the first electrode and the second electrode, and the step of mounting the electronic component on the wiring substrate. The first electrode and the second electrode are electrically connected to each other via the metal. In at least one member selected from the electronic component and the wiring substrate, a preventing structure is formed to prevent molten metal flow out from a region where the first electrode and the second electrode are formed.

Effect of Invention

The mounting structure and the mounting method according to the present invention enable highly accurate connection reliability to be maintained even when the temperature of the use environment is high.

DESCRIPTION OF EMBODIMENT

The exemplary embodiments of the present invention will be described with reference to the drawings. However, the exemplary embodiments are in no way limitative of the technical scope of the present invention.

First Exemplary Embodiment

Figure 1:
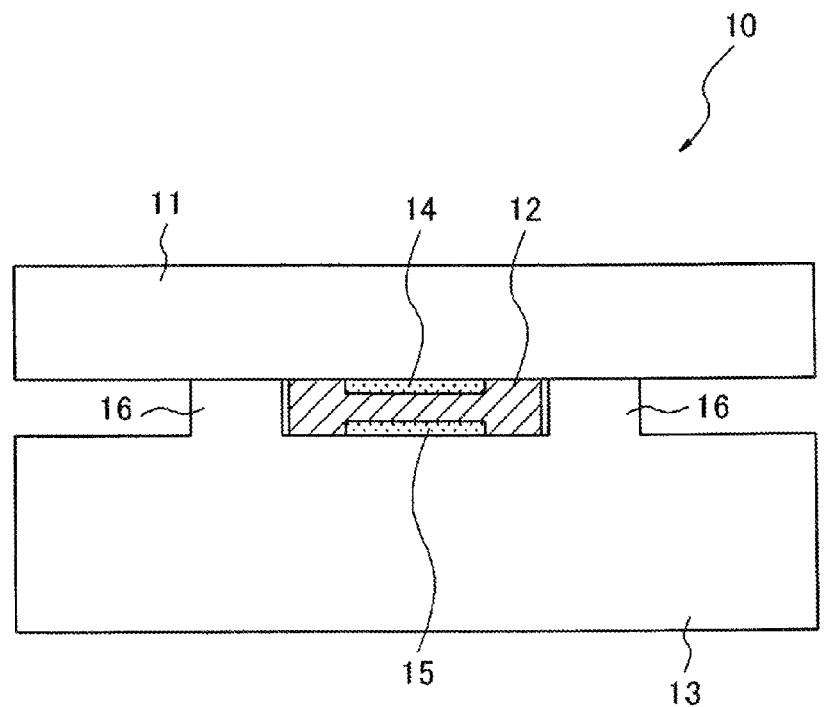
FIG. 1 is a diagram showing an example of the configuration of a mounting structure according to the first exemplary embodiment of the present invention.

Referring to FIG. 1, the mounting structure according to the first exemplary embodiment of the present invention will be described.

Mounting structure 10 according to this exemplary embodiment includes electronic component 11, metal 12, and wiring substrate 13. Electronic component 11 includes first electrode 14. The melting point of metal 12 is 130° C. or less. Accordingly, metal 12 in the exemplary embodiment is melted when the use environment temperature of mounting structure 10 is 130° C. or higher.

First electrode 14 is electrically connected to second electrode 15 via metal 12.

At least one member selected from electronic component 11 and wiring substrate 13 has a preventing structure to prevent metal 12 from flowing out from a region where first electrode 14 and second electrode 15 are formed. The preventing structure in the exemplary embodiment is step 16 formed in wiring structure 13.

Next, a method for forming mounting structure 10 will be described.

First, metal 12 is supplied to second electrode 15 of wiring substrate 13. At this time, a reflow process is carried out when necessary.

Then, electronic component 11 is mounted on wiring substrate 13. At this time, first electrode 14 and second electrode 15 come into contact with metal 12, and accordingly first electrode 14 is electrically connected to second electrode 15. Since the flowing-out of melted metal 12 is prevented by step 16, the electrical connection state between first electrode 14 and second electrode 15 is maintained. Thus, mounting structure 10 of the exemplary embodiment is formed.

As described above, in mounting structure 10 of the exemplary embodiment, electronic component 11 and wiring substrate 13 are connected via metal 12.

Generally, a creeping phenomenon in the solid metal easily occurs when the temperature of the environment in which the mounting structure is used is high, and more easily when the temperature exceeds 130° C. However, since the melting point of metal 12 of the exemplary embodiment is 130° C. or less, metal 12 is melted when the temperature of the environment in which mounting structure 10 is used is equal to a temperature that is higher than 130° C. Thus, since first electrode 14 and second electrode 15 are electrically connected via the melted metal when the temperature of the environment in which mounting structure 10 is used is high, no creeping phenomenon occurs in the connection portion. This can prevent distortion or the generation of cracks generated in the connection portion. As a result, the mounting structure of the exemplary embodiment can maintain highly accurate connection reliability even when the temperature of the environment in which the mounting structure is used is high.

Step 16 prevents flowing-out of melted metal 12 from the region where first electrode 14 and second electrode 15 are formed.

Accordingly, the electrically connected state between first electrode 14 and second electrode 15 is maintained via the melted metal. Short-circuiting caused by the contact of metal 12 with metals other than first electrode 14 and second electrode 15 can be prevented.

In the exemplary embodiment, step 16 is used as the preventing structure to prevent the flowing-out of metal 12. However, the preventing structure is not limited to this. Specifically, as described below in a second exemplary embodiment, in place of or in addition to step 16, micro pillar structures (pillars) can be regularly formed on the surface of at least one member selected from electronic component 11 and wiring substrate 13.

In the exemplary embodiment, metal 12 having a melting point of 130° C. or less is used. However, more desirably, a metal having a melting point of 40° C. or less is used. This is advantageous because, for example, a reflow process can be omitted as described below in the second exemplary embodiment.

Second Exemplary Embodiment

Figure 2:
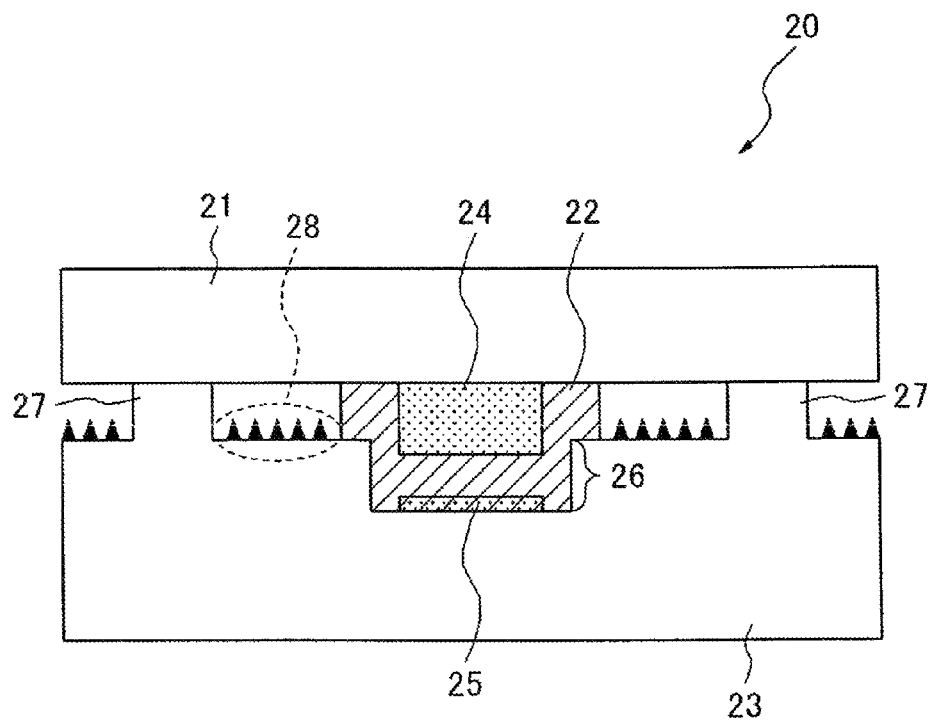
FIG. 2 is a diagram showing an example of the configuration of a mounting structure according to the second exemplary embodiment of the present invention.

Referring to FIG. 2, a mounting structure according to the second exemplary embodiment of the present invention will be described.

Mounting structure 20 according to this exemplary embodiment includes electronic component 21, metal 22, and wiring substrate 23.

Electronic component 21 includes first electrode 24. As electronic component 21, for example, a CSP (Chip Size Package) having pitches of 0.3 mm and 228 pins can be used.

The melting point of metal 22 is 40° C. or less. Mounting structure 20 is normally formed under a temperature environment of about 40° C. except for heat treatment. The temperature, when mounting structure 20 is used, is often 40° C. or higher. Thus, metal 22 in this exemplary embodiment is in a melted state during the normal manufacturing and the use of mounting structure 20.

Wiring substrate 23 includes second electrode 25, dent 26, step 27, and nanopillar structure 28. Nanopillar structure 28 has regularly formed micro pillar structures and is surrounded with second electrode 25.

Dent 26, into which metal 22 is injected, includes second electrode 25 on its bottom surface.

Each of step 27 and nanopillar structure 28 is a preventing structure for preventing flowing-out of metal 22 from a region where first electrode 24 and second electrode 25 are formed.

Specifically, step 27 functions to prevent melted metal 22 from flowing out, as a result of external force, such as shocks caused by dropping, to come into contact with other metals, thus causing short-circuiting. Step 27 also functions to adjust a gap between electronic component 21 and wiring substrate 23. Thus, the height of step 27 is lower than the length of first electrode 24 in a direction vertical to the surface of electronic component 21.

Nanopillar structure 28 that is formed in the surface of wiring substrate 23 has water-repellent and oil-repellent properties. Because of nanopillar structure 28, wet spreading of the melted metal to the outside of nanopillar structure 28 is difficult. Thus, as in the case of step 27, short-circuiting can be prevented by nanopillar structure 28.

Further, first electrode 24 is in contact with metal 22 injected into dent 26. Accordingly, first electrode 24 and second electrode 25 are electrically connected via melted metal 22.

Next, a method for forming mounting structure 20 according to the exemplary embodiment will be described.

First, a method for forming nanopillar structure 28 on wiring substrate 23 will be described. As a method for forming nanopillar structure 28, a forming method using means such as a nanoimprinting method can be used. Specifically, an operator or a manufacturing device prepares a mold made of a metal such as Ni, Si or quartz glass, and presses the mold to a material to be formed while heating it. A resin is used as the material to be formed.

Desirably, the aspect ratio of nanopillar structure 28 is 1 or higher. This is because an aspect ratio of at least 1 or higher is necessary to provide water-repellent and oil-repellent properties to nanopillar structure 28.

Further, the aspect ratio of nanopillar structure 28 is desirably 5 or less. There are two reasons.

The first reason relates to the strength of nanopillar structure 28. Specifically, the aspect ratio of nanopillar structure 28 affects the physical strength of the resin to be formed. When the resin is pressed to be formed by using a mold having an aspect ratio higher than 5, during removal of the resin from the mold, the strength of the resin itself cannot resist the shearing force generated between the mold and the resin, and thus the resin is torn.

The second reason relates to the yield during embossing. Specifically, the manufacturing process of the mold which is used for forming the nanopillar structure includes the step of applying electroforming plating with Ni or the like by using a master acquired by etching Si as a mold and then peeling off the Ni plate from the Si mold. Thus, a yield of the Si etching and a yield during the peeling-off of the Ni plate from the Si mold are generated. When the aspect ratio is higher than 5, the yields are conspicuously deteriorated.

For these reasons, the aspect ratio of nanopillar structure 28 is desirably 5 or less.

The pitch between the centers of the pillar structures of nanopillar structure 28 is desirably 500 nm or less, more desirably 100 nm. This is because while the pitch between the pillar structures is narrow, water-repellent and oil-repellent properties are excellent, and thus the flowing-out of the melted metal can be further prevented. For example, by narrowing the pitch between the pillar structures of a nanopillar structure having an aspect ratio of 1 from 270 nm to 100 nm, the contact angle of the nanopillar structure with pure water can be increased from less than 100° to 150°.

Next, a method for forming step 27 in wiring substrate 23 will be described.

As a method for forming step 27, a method for forming a resist material on the surface of wiring substrate 23 can be used. Alternatively, a method using a hot-melt adhesive or a tape-shaped adhesive having film pressure controlled, or a combination of these methods can be used. As a material for step 27, a thermosetting resin or a thermoplastic resin can be used.

After nanopillar structure 28 and step 27 have been formed, melted metal 22 is injected into dent 26 of wiring substrate 23. For metal 22, for example, a GaIn alloy (GA 75.5 In 24.5) or the like is used.

The GaIn alloy has surface tension lower than those of other representative metals such as mercury. Accordingly, when the GaIn alloy is used for metal 22, for example, the aspect ratio of metal 22 that comes into contact with first electrode 24 can be maintained at 3 or higher. Further, the lower surface tension provides the effect of facilitating connection between the electrodes even when distortion or waving occurs in wiring substrate 23 during manufacturing.

The GaIn alloy has characteristics of lower toxicity compared with mercury. Further, the melting point of the GA 75.5 In 24.5 alloy is 15.7° C., lower than the ambient temperature (30 to 40° C.) of a normal manufacturing line. Thus, the GaIn alloy can be stably supplied by a syringe having a warming function used for supplying a sealing resin at a normal manufacturing line.

Metal 22 is not limited to GA 75.5 In 24.5. Various metals having melting points of 40° C. or less can be used: for example, GA 68.5 In 21.5 Sn 10 (melting point of −19° C.), GA 61 In 25 Sn 13 Zn 1 (melting point of 7.6° C.), Ga (melting point of 29.8° C.), an alloy of Al and Ga, and an alloy of Ag and Ga.

Then, the operator or the manufacturing device aligns electronic component 21 with wiring substrate 23 to which metal 22 has been supplied. Then, the operator or the manufacturing device mounts electronic component 21 on wiring substrate 23 by using a flip chip mounter. At this time, first electrode 24 and second electrode 25 come into contact with metal 22, and accordingly first electrode 24 is electrically connected to second electrode 25. The flowing-out of melted metal 22 is prevented by step 27 and by nanopillar structure 28.

Thus, mounting structure 20 according to the exemplary embodiment is manufactured.

In the exemplary embodiment, metal 22 having a melting point of 40° C. or less is used for connecting first electrode 24 and second electrode 25. Accordingly, first electrode 24 and second electrode 25 are electrically connected via the melted metal during the use of mounting structure 20. Thus, no creeping phenomenon that is generated when the solid metal is used in the connection portion occurs, and failures caused by disconnection in the connection portion can be prevented. As a result, highly accurate connection reliability can be maintained even when the temperature of the environment in which the mounting structre is used is high.

Since melted metal 22 is used, the reflowing of metal 22 is not necessary during the manufacturing process. Thus, positional shifting between electronic component 21 and wiring substrate 23 or distortion of wiring substrate 23 generated by heat during the reflowing, which has been a problem when the two electrodes are connected by the solid metal, can be prevented.

In the exemplary embodiment, the flowing-out of melted metal 22 is prevented by step 27 and by nanopillar structure 28. This maintains the electrical connection between first electrode 24 and second electrode 25. This also provides the effect of preventing short-circuiting that is caused when the melted metal comes into contact with the other electrode.

When the GaIn alloy is used for metal 22, a thin-film aluminum layer of several μm can be formed on the surface of first electrode 24.

The GaIn alloy has the properties that cause aluminum to meet. Accordingly, when the GaIn alloy for metal 22 is supplied to first electrode 24, the GaIn alloy melts the aluminum layer that is formed on the surface of first electrode 24 to meet, thus enabling contact with the unoxidized surface of first electrode 24. In other words, by forming the aluminum layer on the surface of first electrode 24, oxidation of first electrode 24 can be prevented, and wetting of the GaIn alloy can be improved to reduce connection resistance.

Similarly, a thin-film aluminum layer of several lam can be formed on the surface of second electrode 25.

To increase the dropping and shock resistance properties and the vibration resistance of mounting structure 20, a resin for fixing on wiring substrate 23 can be supplied to the outer periphery of electronic component 21. For the fixing resin, a sealing resin that is heat resistance according to the temperature of the environment where mounting structure 20 is used and which is curable at room temperature is desirable. This is because the use of such a resin can prevent distortion of wiring substrate 20 during the heating step of the resin. For such a resin, for example, an epoxy resin, a silicon resin, a urethane resin, or an acrylic resin can be used.

When thermoplastic resin is used for the fixing resin, if a failure is detected after mounting, the defective component can be replaced. Thus, when a high-value-added electronic component or a wiring substrate having many layers necessitating replacement of the defective component is used, the thermoplastic resin that is removable when a failure occurs is desirably used. When thermoplastic resin is used, the influence of heat shocks that are received during the use of mounting structure 20 can be absorbed. For such a resin, a urethane resin, an acrylic resin, or a resin prepared by dispersing thermoplastic resin particles in the thermosetting resin can be used.

In the exemplary embodiment, dent 26 is formed in wiring substrate 23. However, the present invention is not limited to this. Specifically, a dent having first electrode 24 in a bottom surface can be formed in electronic component 21. During the manufacturing of the mounting structure, metal 22 can be injected into the dent.

In the exemplary embodiment, dent 27 is formed in wiring substrate 23. However, the present invention is not limited to this. A step can be formed in electronic component 22.

In the exemplary embodiment, nanopillar structure 28 is formed in wiring substrate 23. However, the present invention is not limited to this. Nanopillar structure 28 can be formed around first electrode 24 of electronic component 21. As in the aforementioned case, since nanopillar structure 28 has water-repellent and oil-repellent properties, wetting and spreading of the melted metal to the outside of nanopillar structure 28 can be prevented.

Alternatively, nanopillar structure 28 can be formed around first electrode 24 of electronic component 21 or around second electrode 25 of wiring substrate 23. In this case, a gap is generated between nanopillar structure 28 formed in the surface of electronic component 21 and nanopillar structure 28 formed in the surface of wiring substrate 23, thereby exhibiting water-repellent and oil-repellent properties as a whole.

Further, in the exemplary embodiment, metal 22 that have a melting point of 40° C. or less is used. However, the present invention is not limited to this. As long as a metal has a melting point of 130° C. or less, a creeping phenomenon, which is generated, when the temperature of the environment in which the mounting structure is used is 130° C. or higher, can be prevented. Metals having melting points of 130° C. or less are, for example, In 66 Bi 34 (melting point of about 72° C.), Sn 16 In 30 Bi 54 (melting point of about 81° C.), Sn 16 Bi 52 Pb 32 (melting point of about 95° C.), and Sn 48 In 52 (melting point of about 117° C.).

Third Exemplary Embodiment

The mounting structure according to the third exemplary embodiment of the present invention will be described. Mounting structure 30 according to this exemplary embodiment includes a thermoplastic resin in the material for step 27 of mounting structure 20 of the second exemplary embodiment. Nanopillar structure 28 is formed not only around second electrode 25 but also around first electrode 24. Other components are similar to those of the second exemplary embodiment, and thus description thereof will be omitted.

Generally, after the electronic component has been mounted on the wiring substrate, an operation test such as a continuity test is conducted to detect whether or not there is a connection failure between the electronic component and the wiring substrate. However, when a large multiple-pin electronic device that is used for a supercomputer or a high-end server is mounted, to carry out the operation test, a portion between the electronic component and the wiring substrate must be sealed and fixed with thermosetting resin such as an epoxy resin. This is because, unless the portion between the electronic component and the wiring substrate is sealed to be fixed, the physical load on the solder connection portion between the electronic component and the wiring substrate will significantly increase, making the operation test difficult.

However, when the portion between the electronic component and the wiring substrate is sealed to be fixed by the thermosetting resin, the thermosetting resin strongly adheres to the electronic component and the wiring substrate. Thus, even if a connection failure is confirmed by the operation test, the thermosetting resin cannot be removed, nor can the wiring substrate be reused. Especially, a recent high-multiple-layer wiring substrate is often made of an organic material which has high productivity. The organic wiring substrate has low heat resistance and low resistance to the removal work of the thermosetting resin compared with a ceramic substrate.

On the other hand, in mounting structure 30 of this exemplary embodiment, first electrode 24 and second electrode 25 are electrically connected via melted metal 22. Thus, different from the aforementioned case, it is not necessary to seal and fix a portion between the electronic component and the wiring substrate by the use of a thermosetting resin, using a thermosetting resin.

Since step 27 includes the thermoplastic resin, when a connection failure is confirmed by the operation test after the electronic component has been mounted on the wiring substrate, the electronic component can be removed to be replaced.

Generally, the electronic component and the high-multiple-layer wiring substrate that are used for the supercomputer or the like are very expensive. Thus, costs can be greatly reduced by enabling removal and replacement of the electronic component when a connection failure is detected during the operation test as in the case of the exemplary embodiment.

The thermoplastic resin is generally a low-elastic resin. Thus, even when distortion occurs in the wiring substrate or in the electronic component, the distortion is reduced by low-elastic resin to present flowing-out of the melted metal.

The specific examples of the thermoplastic resin as the material of step 27 are an acrylic resin, a urethane resin, and a silicon resin. A material that is prepared by dispersing thermoplastic resin particles in the thermosetting resin and enabling removal of the resin at a temperature equal to or higher than a glass-transition temperature can be used for step 27.

In many cases, the glass-transition temperature of a solder resist formed on the surface of wiring substrate 23 is about 100 to 120° C. Accordingly, in the thermoplastic resin used for step 27, a glass-transition temperature is desirably lower than that of the solder resist.

To remove electronic component 21 from wiring substrate 23, an organic solvent for reducing adhesive force between step 27 including the thermoplastic resin and wiring substrate 23 to facilitate disconnection thereof can be used.

Further, in FIG. 2, the surfaces of first electrode 24 and second electrode 25 are formed into pillar shapes. However, in the exemplary embodiment, the surfaces are not limited to pillar shapes. The surfaces of first electrode 24 and second electrode 25 can be conical or hollow.

Fourth Exemplary Embodiment

Figure 3:
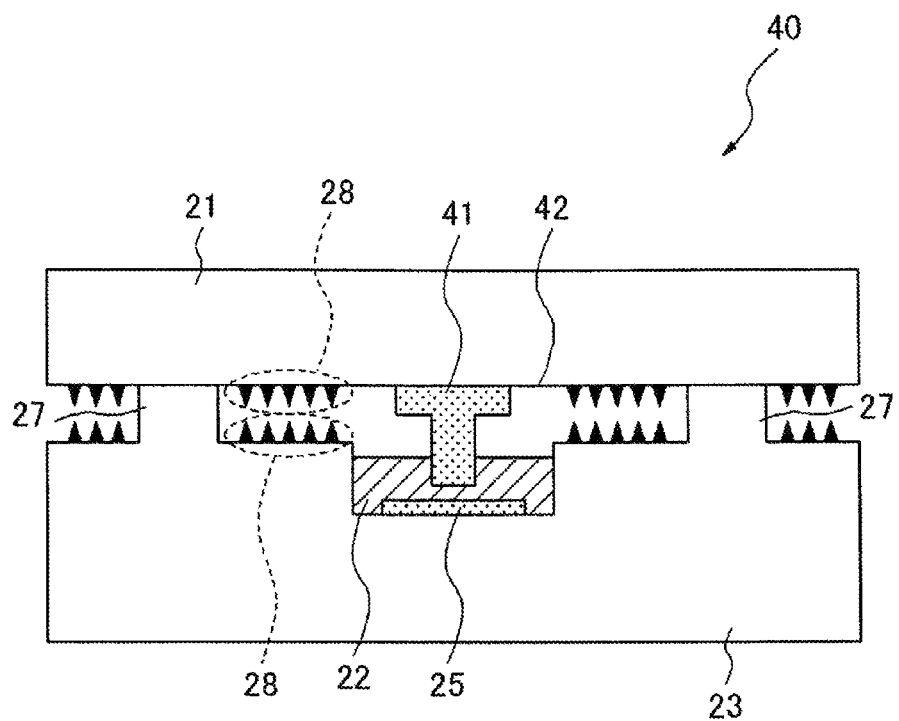
FIG. 3 is a diagram showing an example of the configuration of a mounting structure according to the fourth exemplary embodiment of the present invention.

Referring to FIG. 3, a mounting structure according to the fourth exemplary embodiment of the present invention will be described.

Mounting structure 40 according to this exemplary embodiment includes first electrode 24 whose shape is different from that of mounting structure 20 of the second exemplary embodiment. Nanopillar structure 28 is formed not only around second electrode 25 but also around first electrode 24. Other components are similar to those of the second exemplary embodiment, and thus description thereof will be omitted.

First electrode 41 of mounting structure 40 of the exemplary embodiment is formed in surface 42 of electronic component 21 facing wiring substrate 23. First electrode 41 has a length vertical to surface 42 set larger than a length parallel to surface 42.

In other words, first electrode 41 is formed into a shape having a high aspect ratio that is a value acquired by dividing the length vertical to surface 42 with the length parallel to surface 42.

Figure 4:
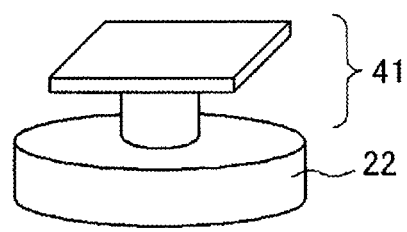
FIG. 4 is a diagram showing a part of the configuration of the mounting structure according to the fourth exemplary embodiment of the present invention.

In the exemplary embodiment, first electrode 41 and second electrode 25 are electrically connected via melted metal 22. In the exemplary embodiment, as shown in FIG. 4, melted metal 22 wraps first electrode 41.

Generally, when wetting of the electrode is caused by the melted metal, even if the electrode is deformed, the melted metal is deformed like stringy starch syrup. Accordingly, a connection state between the electronic component and the wiring substrate can be maintained.

However, when distortion of the wiring substrate and flatness variability generated during manufacturing are large, the electrode of the electronic component may not come into contact with the melted metal. In this case, a connection failure occurs between electronic component 21 and wiring substrate 23.

On the other hand, first electrode 41 is formed so that the length vertical to surface 42 can be longer than the length parallel to surface 42. Thus, even when distortion of wiring substrate 23 or flatness variance occurs, since first electrode 41 can easily come into contact with melted metal 22, a connection failure is difficult to occur between electronic component 21 and wiring substrate 23.

As the method for forming first electrode 41 into a shape having a high aspect ratio, mechanical forming or etching by a nanoimprinting method or a method by laser processing can be used.

The aspect ratio of first electrode 41 is desirably 5 or less. For example, when a CSP having pitches of 0.8 mm is used as first electrode 41, the width (length parallel to surface 42) of first electrode 41 is about 400 to 500 μm. Accordingly, the height (length vertical to surface 42) of first electrode 41 is desirably set to about 2.5 mm or less.

The aspect ratio of first electrode 41 is desirably set to 5 or less, because if the aspect ratio is set higher than 5, as described in the second exemplary embodiment, problems occur in terms of the strength of first electrode 41 and the yield during embossing.

As described above, in the exemplary embodiment, first electrode 41 is formed into a shape having a high aspect ratio. Thus, even when the distance between electronic component 21 and wiring substrate 23 is not constant due to the distortion or the flatness variability of wiring substrate 23, a connection failure thereof can be prevented.

Figure 5A:
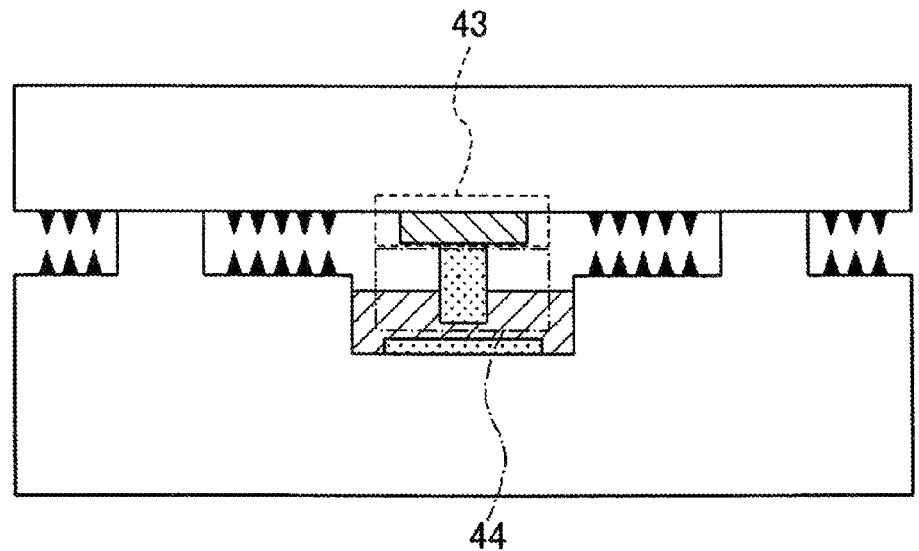
FIG. 5A is a diagram showing a modified example of the configuration of the mounting structure according to the fourth exemplary embodiment of the present invention.
Figure 5B:
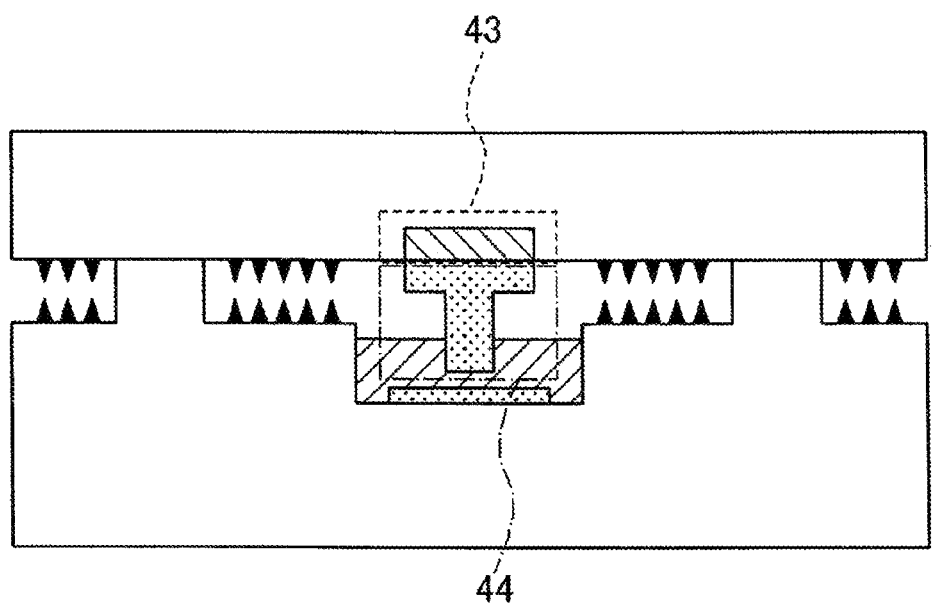
FIG. 5B is a diagram showing a modified example of the configuration of the mounting structure according to the fourth exemplary embodiment of the present invention.

First electrode 41 can be formed by electrode pad 43 and spare solder 44. As a manufacturing method, for example, a method for forming spare solder in the surface electrode pad 43 by a screen printing method can be used. In this case, as shown in FIG. 5A, electrode pad 43 can project from surface 42. Alternatively, as shown in FIG. 5B, electrode pad 43 may not project from surface 42. As a material for the surface of electrode pad 43, for example, Ni, gold or aluminum is used. For spare solder 44, for example, Pb 95 Sn 5, Sn—Cu alloy solder is used.

Fifth Exemplary Embodiment

Figure 6:
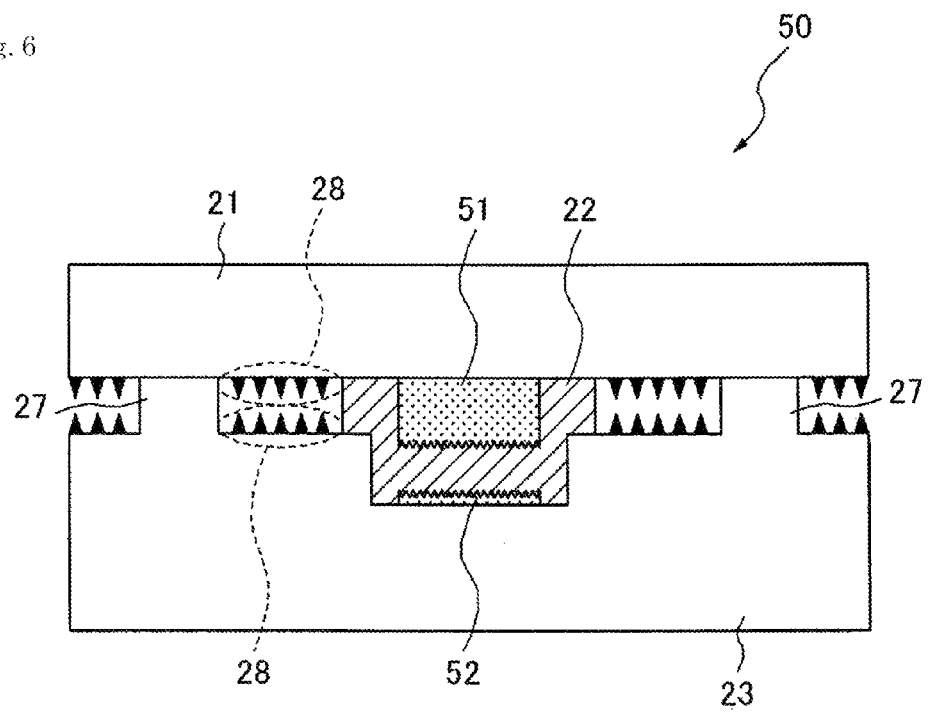
FIG. 6 is a diagram showing an example of the configuration of a mounting structure according to the fifth exemplary embodiment of the present invention.

Referring to FIG. 6, a mounting structure according to the fifth exemplary embodiment of the present invention will be described.

Mounting structure 50 according to this exemplary embodiment includes a concave-convex shape formed on the surface of each of first electrode 51 included in electronic component 21 and second electrode 52 included in wiring substrate 23. Thus, as compared with the second exemplary embodiment, the surface area of first electrode 51 that comes into contact with metal 22 and the surface area of second electrode 52 that comes into contact with metal 22 are larger. Nanopillar structure 28 is formed not only around second electrode 52 but also around first electrode 51. Other components are similar to those of the second exemplary embodiment, and thus description thereof will be omitted.

As the method for forming the concave-convex shapes on the surfaces of first electrode 51 and second electrode 52, mechanical forming or etching by a nanoimprinting method or a method by laser processing can be used.

When micro pillar structures are formed on the surfaces of first electrode 51 and second electrode 52, the pitch between the centers of the pillar structures is desirably 500 nm or higher. This is because the narrower the pitch between the pillar structures, the greater is the improvement in water repellency, and wetting of metal 22 is lowered. For example, it is known that when water drops on resin where the pitch between pillar structures is relatively narrow (about 150 nm), a state similar to that where mercury rolls on glass is set. It is also because when a shape having a large aspect ratio is formed, if the pitch between the pillar structures is set lower than 500 nm, problems such as yield deterioration occur.

The aspect ratios of the concave-convex shapes that are formed on the surfaces of first electrode 51 and second electrode 52 are desirably set to 0.01 or less. This is because the higher the aspect ratio, the greater is the improvement in the water repellency of the electrode surface, thus making wet spreading of metal 22 difficult on the electrode surface.

As described above, in the exemplary embodiment, the surface area of first electrode 51 that comes into contact with metal 22 and the surface area of second electrode 52 that comes into contact with metal 22 are large. This can reduce, during the use of mounting structure 50, connection resistance between melted metal 22 and first electrode 51, second electrode 52.

The shapes of first electrode 51 and second electrode 52 that enlarge the surface area of first electrode 51 that comes into contact with metal 22 and the surface area of second electrode 52 that comes into contact with metal 22 are not limited to the concave-convex shapes formed on the surfaces of first electrode 51 and second electrode 52.

Figure 7A:
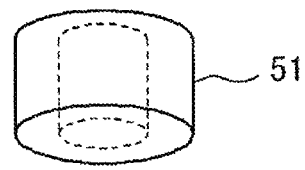
FIG. 7A is a diagram showing a modified example of the electrode of the mounting structure according to the fifth exemplary embodiment of the present invention.
Figure 7B:
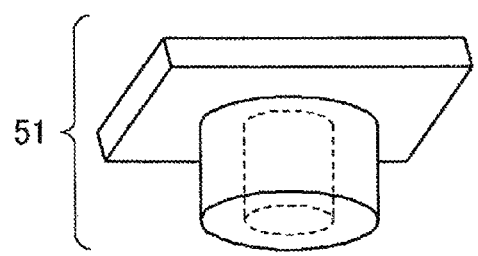
FIG. 7B is a diagram showing a modified example of the electrode of the mounting structure according to the fifth exemplary embodiment of the present invention.

For example, as shown in FIG. 7A, a hole having a hollow shape can be formed in first electrode 51. Alternatively, as shown in FIG. 7B, first electrode 51 can include a planar electrode pad and hollow spare solder. FIGS. 7A and 7B show first electrode 51 formed in electronic component 21 when observed obliquely from the lower side.

Similarly, a hole having a hollow shape can be formed in second electrode 52.

Sixth Exemplary Embodiment

Figure 8:
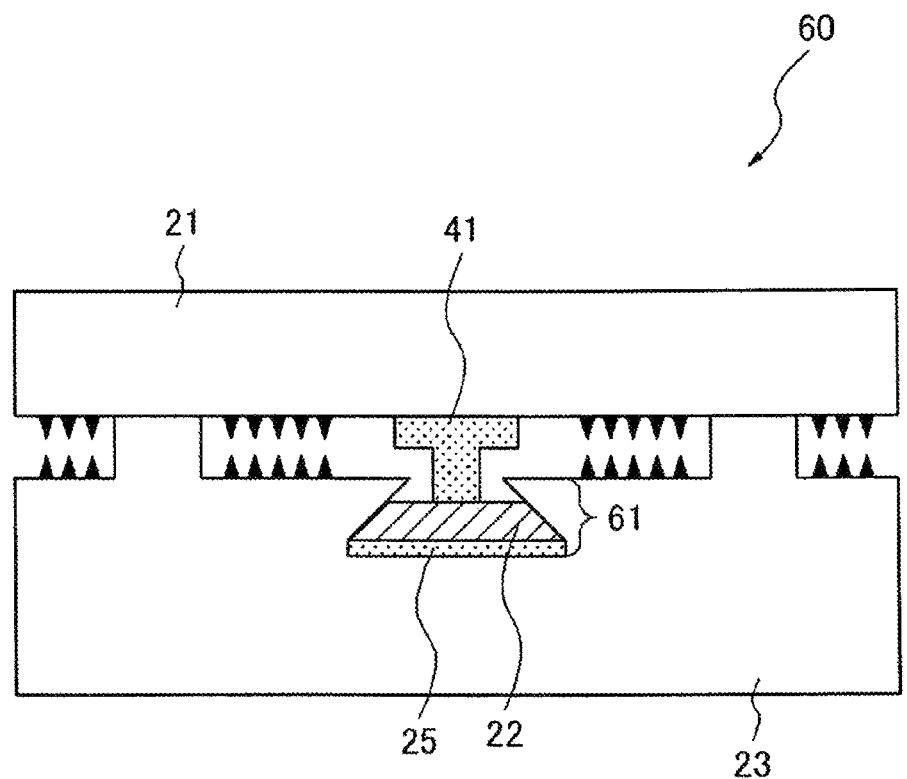
FIG. 8 is a diagram showing an example of the configuration of a mounting structure according to the sixth exemplary embodiment of the present invention.

Referring to FIG. 8, a mounting structure according to the sixth exemplary embodiment of the present invention will be described.

In mounting structure 60 according to this exemplary embodiment, dent 27 of mounting structure 40 of the fourth exemplary embodiment has a shape similar to that of dent 61 shown in FIG. 8. Other components are similar to those of mounting structure 40, and thus description thereof will be omitted.

As shown in FIG. 8, dent 61 of the exemplary embodiment is formed into a shape so that an area in the in-plane direction of the surface of wiring substrate 23 can be larger from the surface of wiring substrate 23 in a depth direction. In the exemplary embodiment, the side face of dent 61 inclines in a direction vertical to the surface of wiring substrate 23.

This shape of dent 61 can prevent flowing-out of melted metal 22 from dent 61 even when mounting structure 60 is used in an environment of severe vibrations. As a result, short-circuiting that is caused when metal 22 comes into contact with metal of the other region can be prevented. The metal of the other region is an electrode other than first electrode 41 and second electrode 25 or a metal that has come into contacted with this electrode.

In the exemplary embodiment, dent 61 has a structure where its side face inclines. However, the structure is not limited to this. For example, dent 61 can be formed into a shape so that its side face can have a step, and the area in the in-plane direction of the surface of wiring substrate 23 can be gradually larger from the surface of wiring substrate 23 in the depth direction. Even with such a shape, since it is difficult for melted metal 23 to flow out from dent 61, short-circuiting can be prevented even when dent 61 is used in an environment where there is severe vibration.

Seventh Exemplary Embodiment

Figure 9:
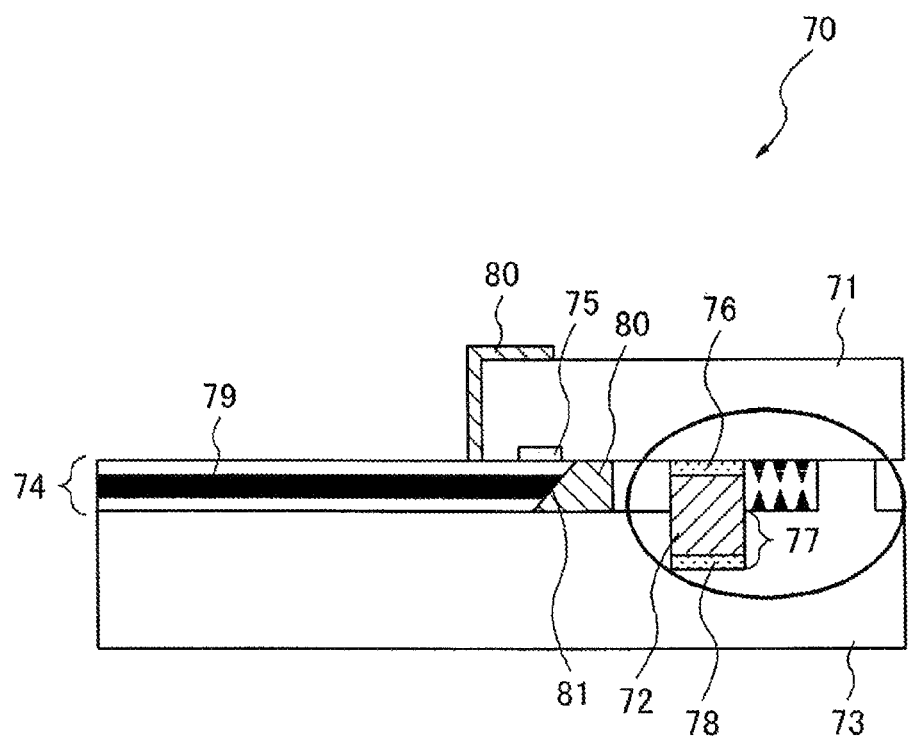
FIG. 9 is a diagram showing an example of the configuration of a mounting structure according to the seventh exemplary embodiment of the present invention.

Referring to FIG. 9, a mounting structure according to the seventh exemplary embodiment of the present invention will be described.

Mounting structure 70 according to this exemplary embodiment includes chip 71, metal 72, wiring substrate 73, and waveguide structure 74.

Chip 71 includes emission region 75 and first electrode 76. The melting point of metal 72 is 40° C. or less. Accordingly, metal 72 is melted during the manufacturing process and while mounting structure 70 is being used. Wiring substrate 71 includes dent 77, and second electrode 78 formed on the bottom surface of dent 77. Metal 72 is injected into dent 77. Waveguide structure 74 including optical waveguide 79 is formed on wiring substrate 73. First electrode 76 and second electrode 78 are electrically connected via metal 72.

Chip 71 is fixed so that light with is emitted from emission region 75 can be coupled with optical waveguide 79. Chip 71 and waveguide structure 74 are fixed by resin 80 so that the occurrence of positional shifting between them is prevented.

Of the end surfaces of waveguide structure 74, end surface 81 that is located directly below emission region 75 is a slope end surface formed obliquely to the vertical direction of the surface of wiring substrate 73. Thus, as compared with a case where end surface 81 does not incline, the coupling efficiency of light emitted from emission region 75 with optical waveguide 79 can be improved.

In the exemplary embodiment, connection between chip 71 and wiring substrate 73 is realized by melted metal 72. Thus, the reflowing of metal 72 is not necessary during the manufacturing process. As a result, optical axis adjustment is easy without any positional shifting caused between chip 71 and waveguide structure 74 by heat generated during the reflowing. After the optical axis adjustment has been completed, chip 71 and waveguide structure 74 are fixed by resin 80.

As resin 80, for example, an ultraviolet curable adhesive having low cure shrinkage can be used.

In mounting structure 70 according to the exemplary embodiment, wiring substrate 73 includes dent 77, and metal 27 is injected into dent 77. However, the structure is not limited to this. For example, a structure where chip 71 includes a dent having first electrode 76 in its bottom surface may be used. Metal 72 is injected into the dent. Alternatively, both chip 71 and wiring substrate 73 can have dents into which metal 72 is injected. Otherwise, neither chip 71 nor wiring substrate 73 has any dent.

In the exemplary embodiment, at least one of first electrode 76 and second electrode 78 can include an electrode pad and spare solder.

In the exemplary embodiment, a metal film can be formed on end surface 81. Thus, the coupling efficiency of the light emitted from emission region 75 with optical waveguide 79 can be improved.

In mounting structure 70 according to the exemplary embodiment, the mounting structure of each of the first to sixth exemplary embodiments can be applied to a region in a black circle shown in FIG. 9.

The whole or part of the exemplary embodiments disclosed above can be described as, but not limited to, the following supplementary notes.

(Supplementary note 1) A mounting structure comprising: an electronic component including a first electrode; a metal having a melting point of 130° C. or less; and a wiring substrate including a second electrode, wherein: the first electrode and the second electrode are electrically connected to each other via the metal; and in at least one member selected from the electronic component and the wiring substrate, a preventing structure for preventing flowing-out of the metal from a region where the first electrode and the second electrode are formed is formed.

(Supplementary note 2) The mounting structure according to supplementary note 1, wherein the metal has a melting point of 40° C. or less.

(Supplementary note 3) The mounting structure according to supplementary note 1 or 2, wherein the preventing structure includes a step formed in at least one member selected from the electronic component and the wiring substrate.

(Supplementary note 4) The mounting structure according to supplementary note 3, wherein a length of the first electrode in a direction vertical to a surface of the electronic component is longer than the height of the step.

(Supplementary note 5) The mounting structure according to any one of supplementary notes 1 through 4, wherein the preventing structure includes regularly arranged pillar structures formed on a surface of at least one member selected from the electronic component and the wiring substrate.

(Supplementary note 6) The mounting structure according to supplementary note 5, wherein the pitch between centers of the pillar structures is 500 nm or less.

(Supplementary note 7) The mounting structure according to supplementary note 5 or 6, wherein an aspect ratio of the pillar structure is for higher.

(Supplementary note 8) The mounting structure according to any one of supplementary notes 1 through 7, wherein at least one of the electronic component and the wiring substrate includes a dent into which the metal is injected, and the first electrode or the second electrode is formed on a bottom surface of the dent.

(Supplementary note 9) The mounting structure according to supplementary note 8, wherein the wiring substrate includes the dent, and an area of the dent in an in-plane direction of the surface of the wiring substrate is larger from the surface of the wiring substrate in the depth direction.

(Supplementary note 10) The mounting structure according to any one of supplementary notes 1 through 9, wherein the electronic component and the wiring substrate are bonded by a resin on an outer periphery of the metal.

(Supplementary note 11) The mounting structure according to any one of supplementary notes 1 through 10, wherein the material of the metal is an alloy containing at least one metal selected from gallium and indium.

(Supplementary note 12) The mounting structure according to any one of supplementary notes 1 through 11, wherein the first electrode includes a first electrode pad and first solder formed on a surface of the first electrode pad.

(Supplementary note 13) The mounting structure according to any one of supplementary notes 1 through 12, wherein the first electrode is formed on a first surface of the electronic component facing the wiring substrate, and the first electrode has a length vertical to the first surface set larger than the length parallel to the first surface.

(Supplementary note 14) The mounting structure according to any one of supplementary notes 1 to 13, wherein the shape of the first electrode is hollow.

(Supplementary note 15) The mounting structure according to any one of supplementary notes 1 to 14, wherein a concave-convex shape having an aspect ratio of 0.01 or less is formed on a surface of at least one electrode selected from the first electrode and the second electrode.

(Supplementary note 16) The mounting structure according to any one of supplementary notes 1 through 15, wherein an aluminum layer is formed on the surface of at least one electrode selected from the first electrode and the second electrode.

(Supplementary note 17) The mounting structure according to any one of supplementary notes 1 through 16, wherein a waveguide structure having an optical waveguide is formed on a surface of the wiring substrate, the electronic component includes an emission region, the electronic component and the waveguide structure are bonded together by a resin, and light that is emitted from the emission region is coupled with the waveguide.

(Supplementary note 18) The mounting structure according to supplementary note 17, wherein of the end surfaces of the waveguide structure, an end surface that is located directly below the emission region is a slope end surface formed obliquely to the vertical direction of the surface of the wiring substrate.

(Supplementary note 19) The mounting structure according to supplementary note 18, wherein a metal layer is formed on the slope end surface.

(Supplementary note 20) A mounting method for mounting an electronic component including a first electrode on a wiring substrate including a second electrode, the method comprising: supplying a metal having a melting point of 130° C. or less to at least one electrode selected from the first electrode and the second electrode; and mounting the electronic component on the wiring substrate, wherein: the first electrode and the second electrode are electrically connected to each other via the metal; and in at least one member selected from the electronic component and the wiring substrate, a preventing structure is formed to prevent flowing-out of the metal from a region where the first electrode and the second electrode are formed.

(Supplementary note 21) The mounting structure according to Supplementary note 20, wherein the metal has a melting point of 40° C. or less.

This application is based upon and claims the benefit of priority from Japanese patent application No. 2010-259727, filed on Nov. 11, 2010, the disclosure of which is incorporated herein in its entirety by reference.

REFERENCE NUMERALS 10, 20, 40, 50, 60, 70 Mounting structure
11, 21 Electronic component
12, 22, 72 Metal
13, 23, 73 Wiring substrate
14, 24, 41, 51, 76 First electrode
15, 25, 52, 78 Second electrode
16, 27 Step
26, 61, 77 Dent
28 Nanopillar structure
42 Surface
43 Electrode pad
44 Spare solder
71 Chip
74 Waveguide structure
75 Emission region
79 Optical waveguide
80 Resin
81 End surface

The invention claimed is:

1. A mounting structure comprising:
an electronic component including a first electrode;
a metal having a melting point of 130° C. or less;
a wiring substrate including a second electrode electrically connected to the first electrode via the metal; and
a preventing structure for preventing flowing-out of the metal in a melted state from a region where the first electrode and the second electrode are formed, wherein the preventing structure is formed in at least one member selected from the electronic component and the wiring substrate;
wherein a waveguide structure having an optical waveguide is formed on a surface of the wiring substrate, wherein the electronic component includes an emission region, wherein the electronic component and the waveguide structure are bonded together by a resin, and wherein light emitted from the emission region is coupled with the waveguide; and
wherein an end surface of the waveguide structure is located directly below the emission region is a slope end surface formed obliquely to the vertical direction of the surface of the wiring substrate.

2. The mounting structure according to claim 1 wherein the melting point of the metal is 40° C. or less.

3. The mounting structure according to claim 1 wherein the preventing structure includes a step formed in at least one member selected from the electronic component and the wiring substrate.

4. The mounting structure according to claim 1 wherein a material of the metal is an alloy containing at least one metal selected form gallium and indium.

5. The mounting structure according to claim 1:
wherein the first electrode is formed on a first surface of the electronic component facing the wiring substrate; and
wherein the first electrode has a length vertical to the first surface set larger than a length parallel to the first surface.

6. The mounting structure according to claim 1 wherein a shape of the first electrode is hollow.

7. The mounting structure according to claim 1 wherein a concave-convex shape having an aspect ratio of 0.01 or less is formed on a surface of at least one electrode selected from the first electrode and the second electrode.

8. The mounting structure according to claim 1 wherein at least one of the electronic component and the wiring substrate includes a dent into which the metal is injected, and wherein the first electrode or the second electrode is formed on a bottom surface of the dent.

9. The mounting structure according to claim 1 wherein the electronic component and the wiring substrate are bonded by a resin on an outer periphery of the metal.

10. The mounting structure according to claim 1 wherein the first electrode includes a first electrode pad and first solder formed on a surface of the first electrode pad.

11. The mounting structure according to claim 1 wherein a metal layer is formed on the slope end surface.

* * * * *